United States Patent
Talyansky et al.

(10) Patent No.: US 9,866,623 B2
(45) Date of Patent: Jan. 9, 2018

(54) SYSTEM AND METHOD FOR OPTIMIZING INTER-NODE COMMUNICATION IN CONTENT DISTRIBUTION NETWORK

(71) Applicant: Beijing Blue I.T. Technologies Co., Ltd., Beijing (CN)

(72) Inventors: Michael Talyansky, Sunnyvale, CA (US); Alexei Tumarkin, Los Altos Hills, CA (US)

(73) Assignee: BEIJING BLUE I.T. TECHNOLOGIES CO., LTD., Beijing (CN)

( * ) Notice: Subject to any disclaimer, the term of this patent is extended or adjusted under 35 U.S.C. 154(b) by 422 days.

(21) Appl. No.: 14/383,062

(22) PCT Filed: Oct. 8, 2012

(86) PCT No.: PCT/CN2012/082582
§ 371 (c)(1),
(2) Date: Sep. 4, 2014

(87) PCT Pub. No.: WO2014/019287
PCT Pub. Date: Feb. 6, 2014

(65) Prior Publication Data
US 2015/0032850 A1    Jan. 29, 2015

Related U.S. Application Data

(60) Provisional application No. 61/679,357, filed on Aug. 3, 2012.

(51) Int. Cl.
*G06F 15/16* (2006.01)
*H04L 29/08* (2006.01)
(Continued)

(52) U.S. Cl.
CPC ............ *H04L 67/10* (2013.01); *H04L 67/289* (2013.01); *H04L 67/2842* (2013.01);
(Continued)

(58) Field of Classification Search
CPC ..... H04L 67/10; H04L 67/2842; H04L 67/28; H04L 67/288; H04L 67/289; H04L 67/2828; H04L 69/04; H03M 7/3088
(Continued)

(56) References Cited

U.S. PATENT DOCUMENTS 6,460,047 B1    10/2002 Ambroziak
6,820,133 B1    11/2004 Grove et al.
(Continued)

FOREIGN PATENT DOCUMENTS

CN    102082726    6/2011

*Primary Examiner* — Liangche A Wang
*Assistant Examiner* — Johnny Aguiar
(74) *Attorney, Agent, or Firm* — Harness, Dickey & Pierce, P.L.C.

(57) ABSTRACT

The invention relates to communication between computers such as servers within a content distribution network, where the communication is carried over the Internet in which bandwidth usage and cost are of concern, and particularly to a system and method for optimizing inter-node communication in a content distribution network. The method includes: generating a mutable warm dictionary for a specific domain according to a current inter-node communication; generating a fixed warm dictionary for the specific domain from the mutable warm dictionary; and performing the next inter-node communication for the specific domain according to the fixed warm dictionary.

8 Claims, 4 Drawing Sheets

---

301: For each chunk of content find a match in the dictionary

↓

302: If a match was found then increment the counter of matches and matched bytes

↓

303: If the match was not found then add the chunk to the dictionary (51) Int. Cl.
   *H03M 7/30*     (2006.01)
   *H04L 29/06*    (2006.01)

(52) U.S. Cl.
   CPC ........... *H03M 7/3088* (2013.01); *H04L 67/28* (2013.01); *H04L 67/288* (2013.01); *H04L 67/2828* (2013.01); *H04L 69/04* (2013.01)

(58) Field of Classification Search
   USPC ................................ 709/218, 223, 231, 247
   See application file for complete search history.

(56) References Cited

U.S. PATENT DOCUMENTS

| | | |
|---|---|---|
| 6,856,651 B2 | 2/2005 | Singh |
| 7,098,815 B1 | 8/2006 | Samuels et al. |
| 7,620,870 B2 | 11/2009 | Srinivasan et al. |
| 7,916,047 B2 | 3/2011 | Samuels et al. |
| 7,927,237 B2 | 4/2011 | Jenkins et al. |
| 8,018,866 B1 | 9/2011 | Kasturi et al. |
| 8,069,225 B2 | 11/2011 | McCanne et al. |
| 8,250,325 B2 | 8/2012 | Holdman et al. |
| 8,667,235 B2 | 3/2014 | Williams et al. |
| 2002/0059462 A1* | 5/2002 | Hannu .................... H03M 7/30 709/247 |
| 2002/0152219 A1* | 10/2002 | Singh ...................... H04L 69/04 |
| 2005/0027731 A1* | 2/2005 | Revel ...................... H04L 69/04 |
| 2008/0133536 A1* | 6/2008 | Bjorner .................. H03M 7/30 |
| 2009/0187673 A1* | 7/2009 | Ramjee ............... H04L 67/2828 709/247 |
| 2011/0222596 A1 | 9/2011 | Huang et al. |
| 2011/0246741 A1* | 10/2011 | Raymond ......... G06F 17/30159 711/170 |
| 2012/0296983 A1* | 11/2012 | Boehm ............... H03M 7/3088 709/206 |

\* cited by examiner

SYSTEM AND METHOD FOR OPTIMIZING INTER-NODE COMMUNICATION IN CONTENT DISTRIBUTION NETWORK

CROSS REFERENCE TO RELATED APPLICATIONS

This application claims the benefit of and hereby incorporates by reference in its entirety U.S. Provisional Application No. 61/679,357, entitled "System and Method for Optimizing Inter-Node Communication in a Content Distribution Network", filed on 3 Aug. 2012.

FIELD OF THE INVENTION

The invention relates to communication between computers such as servers within a content distribution network, where the communication is carried over the Internet in which bandwidth usage and cost are of concern, and particularly to a system and method for optimizing inter-node communication in a content distribution network.

BACKGROUND

The global Content Delivery Network (CDN) market is projected to reach $4.7 billion by 2015 according to a report by Global Industry Analysts, Inc. (www.prweb.com). This is how GIA (Global Industry Analysts) describes the driving factors for CDN adoption: "Rapid expansion of the Internet is forcing services and providers to compete for finite computing and network resources. The resource crunch is particularly significant for enterprise websites, as high degree of availability and instantaneous response are essential for ensuring success of business operations. Problems are also faced due to bandwidth availability that restrict usage and prevent scalability, resulting in loss of packet data, inferior quality of streaming, and congestion. Rapid growth of Internet-based services such as online music, online video, and online games, is expected to place additional strain on the Internet infrastructure, and enhance the demand for high quality-of-service requirements. Consequently, the demand for specialized content delivery infrastructure is expected to witness substantial growth. Content Delivery Networks (CDNs) have emerged as ideal solutions for managing the Internet service degradation, by moving the content to the edge of the Internet, and closer to the end-users."

Bandwidth Crunch

CDNs are facing a challenging problem of inability to store all content requested by users in their caches/servers near those users. Not only the Web content becomes more and more personalized and hence non-cacheable, but also the number of infrequently accessed static objects becomes larger and larger (the so-called long-tail problem). Indeed, according to multiple academic studies, "Online content distribution technologies have witnessed many advancements over the last decade, from large CDNs to P2P technologies, but most of these technologies are inadequate while handling unpopular or long-tailed content. By longtailed we refer to the popularity of the content, in terms of accesses. CDNs find it economically infeasible to deal with such content—the distribution costs for content that will be consumed by very few people globally is higher than the utility derived from delivering such content" (Traverso et al., "Handling Long-Tail Content with a Little Help from Friends": www2012.wwwconference.orq).

A typical CDN architecture which deals with cache misses (and non-cacheable/dynamic content) is a hierarchical system of proxies/servers which constantly relay requests and responses, generating a huge amount of inter-node communication. The increased costs associated with such communications are a driving factor of implementing bandwidth saving solutions within such CDNs.

One prior art approach to bandwidth savings is WAN (Wide Area Network) optimization. According to Gartner, the market for such products will grow to $4.44 billion in 2014 (www.gartnercom). While WAN optimization solutions are designed to provide many benefits covered in the present invention, they are costly and cannot be fully integrated with the CDN network elements (in particular they cannot use any feedback mechanisms from the CDN systems). Another major distinction is that content distribution network is using a many-to-many architecture where each network element is communicating to many peers, which in turn are communicating to many other nodes. A typical WAN optimization scenario is one-to-one or one-to-many (for example, when one device is installed in company's headquarters and other devices are in satellite offices). The main difficulty with a many-to-many architecture is the need to have synchronized dictionaries for all pairs of peers.

One of the most challenging technical problems in a traffic reduction solution is the trade-off between the size of the dictionary (which is the main factor on achieving higher compression rates) and the latency caused by longer searches for matches in the larger dictionary and, consequently, higher CPU loads. With many peers, the size of the dictionary (or of the set of dictionaries corresponding to all pairs of communicating nodes) can grow dramatically, and can result in unacceptable performance and latency levels.

There is therefore a need in the art for an approach to reduce the inter-node traffic within a content distribution network, which does not require significant computer resources and which can be fully integrated with other CDN (or P2P) services.

SUMMARY

The present invention is a method and system for reducing the traffic within a content distribution system by creating a specialized compression scheme tightly integrated with the software components of said content distribution system.

The main distinguishing feature of this invention is the optimized architecture of the compression solution which is exploiting the feedback mechanism from the content distribution system, does not require any additional hardware, and permits coordinated compilations and updates to data compression dictionaries.

An embodiment of the invention provides a method for optimizing inter-node communication in a content distribution system consisting of at least two nodes, including:
generating a mutable warm dictionary for a specific domain according to a current inter-node communication;
generating a fixed warm dictionary for the specific domain from the mutable warm dictionary; and
performing the next inter-node communication for the specific domain according to the fixed warm dictionary.

An embodiment of the invention provides a system for optimizing inter-node communication in a content distribution system consisting of at least two nodes, including:

a first generating module configured to generate a mutable warm dictionary for a specific domain according to a current inter-node communication;

a second generating module configured to generate a fixed warm dictionary for the specific domain from the mutable warm dictionary; and a communicating module configured to perform the next inter-node communication for the specific domain according to the fixed warm dictionary.

With the solutions of the embodiments of the invention, the inter-node traffic within a content distribution system is reduced.

BRIEF DESCRIPTION OF THE DRAWINGS

The details of one or more implementations of the subject matter described in this specification are set forth in the accompanying drawings and the description below. Other features, aspects, and advantages of the subject matter will become apparent from the description, the drawings, and the claims.

Like reference numbers and designations in the various drawings indicate like elements.

DETAILED DESCRIPTION

Figure 1:
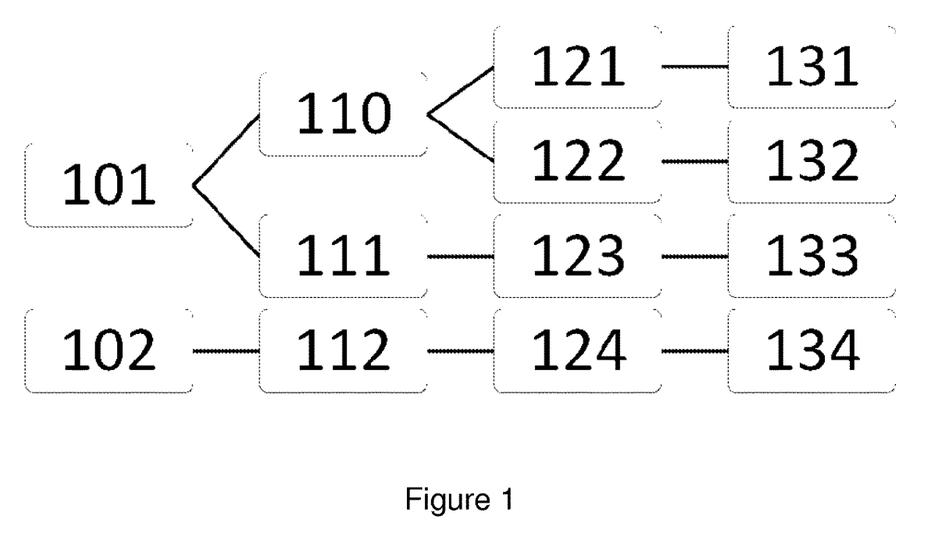
FIG. 1 is a schematic illustration of a content distribution network serving the content to the clients on behalf of the content provides in the prior art.

In a content delivery system, such as the one depicted in FIG. 1, a multitude of clients 101-102 are requesting the content from origin servers (content providers) 131-134. The traffic is transparently intercepted by the nodes 110-112 belonging to a content delivery operator, which are acting on behalf of content providers 131-134. Whenever the requested objects reside already in caches on nodes 110-112, these requests are served immediately. However, if the requested objects are not already cached (or cannot be cached because of their volatile and/or dynamic nature), these requests are relayed to other nodes in content delivery system 121-124 which might have these objects in their caches or are in a better position to retrieve these objects from the origin servers 131-134. A reduction of the amount of traffic between the nodes 110-112 and 121-124 is the subject of the present invention.

A common approach to bandwidth savings is called Data Redundancy Elimination (DRE), also known as Redundant Traffic Elimination (RTE) (e.g., pages.cpsc.ucalgary.ca), and is a technique used (under different brand names) by many products on the market, such as Cisco WAAS (www.cisco.com), Riverbed WAN Optimization (www.riverbed.com) and others.

The general idea of such products is to reduce the number of payload bytes transmitted on a network link by creating a mutable dictionary or cache of data seen on the link, on both sides of the link, and then detect repeating patterns in the network payload, and avoid sending the already seen data chunks to the peer, if it is known that peer has these previously seen chunks stored in its dictionary.

There are many variations of this technique, such as object-based de-duplication (this is what Web caches also do, to some extent): a smart de-duplicator will apply differential encoding algorithms to objects, and send only the differences to its peer, provided it knows which version of the object the peer has.

In a preferred embodiment, unlike the existing products, a DRE encoder operates above the TCP stack, compressing a stream of content, so it is implemented as a software module inside a content distribution proxy or cache, such as Nginx, Squid or Varnish (see, e.g., en.wikipedia.org). Therefore it allows access to high-level (e.g., HTTP) protocol data.

This DRE encoder module uses a universal high-performance C++ library with a high-level C interface, so it may be used by both C and C++ programs. There is also a Python Pyrex binding for the C API (Application Program Interface), so it is possible to write Python programs that use DRE—for example, to find the optimal parameters for different traffic patterns using one of the standard optimization techniques (such as en.wikipedia.org).

Figure 2:
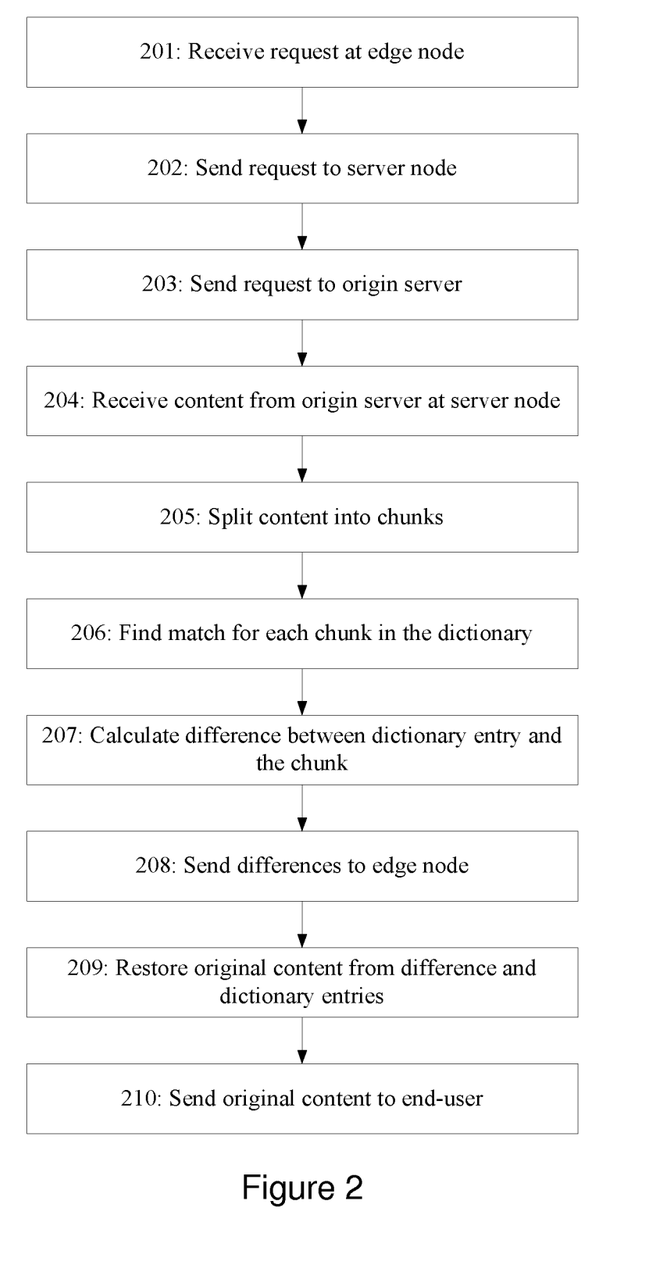
FIG. 2 is a flowchart of a request-response sequence in the prior art.

Internally DRE encoder module operates on equal chunks of data and is depicted in FIG. 2 in steps 204-208. The choice of the size is an optimizable tuning parameter, and depends on the traffic patterns. A more sophisticated approach is using unequal chunks which can be expanded or reduced based on matching statistics collected over a certain time period. Larger input data sets will be broken down into standard chunks by the higher-level DRE API and processed in sequence; there is also an option of doing this chunking on the application level, in which case the application will use a lower-level chunk API.

Chunk-level encoding is implemented in a special fast case of ReEncode API. On input, a chunk will be fingerprinted using, for example, the MAXP algorithm (research.microsoft.com), and the encoder will search the internal fingerprint hash table for repeating fingerprints. If any such are found, encoder will access the chunk storage (which may reside in memory cache, in a disk file or on a raw disk partition) and will determine the largest consecutive span of repeating data. If the length of this span exceeds a certain (configurable) threshold, encoder will insert a reference to the relevant offsets in the stored chunk into the output stream, and not insert the repeating span. At the end of chunk processing, the output buffer will contain a mix of references to data in stored chunks and unique input data, and encoder will return one of the following three success verdicts:

ReENotCompressedStored—encoder has not compressed any data in the chunk, but has stored the input chunk in the dictionary. Please note that in this case ReEncode API will not copy (unchanged) input data to the output data, thus allowing a zero-copy handling of uncompressed chunks.

ReECompressedStored—encoder has compressed the data in the input chunk, and has stored the input chunk in the dictionary. Compressed data will be found in the output buffer.

ReECompressedNotStored—encoder has compressed the data in the input chunk, but has NOT stored the input chunk. This happens when the amount of unique data in the input chunk is lower than a (configurable) threshold, thus making it not beneficial to store this chunk. Compressed data will be found in the output buffer.

ReEncode API will also return total length of output data. At this point, it is a responsibility of the application to reliably deliver output data and the chunk verdict to the decoding peer. In case of error, ReEncode API will return an appropriate error code. One error code is worth a special mention: ReEDictionaryReset tells the caller application that encoder has encountered an internal error and cannot continue operating on the current state of the dictionary, so the caller must tell the peer to reset its dictionary and also reset its own. Encoder processing can only continue after both peers have successfully reset their dictionaries and communicated the success state to each other.

If the size of input is larger than one encoding chunk, ReEncode API will break it down into right-sized chunks, and process them in sequence, returning an array of chunk verdicts and an array of compressed chunk lengths. In a special optimized case, data will not be copied into the output buffer if encoding verdicts on ALL input chunks are ReENotCompressedStored. Application will have to deliver these two arrays, number of chunks and output data buffer to the decoding peer, using whatever format it sees fit.

There is a special higher-level encoding API—ReEncodeBuffer—that makes it easier for the applications to build a full bundle of data to be delivered to the peer: number of chunks, verdict array, lengths array and compressed payload. It takes a data buffer to encode and produce output that combines all ingredients together in an internal format understood by the decoding peer, so the caller only has to send the whole bundle to the peer.

Decoder Operation

Operation of the decoder module as depicted in the step 209 of FIG. 2 is a reverse of that of encoder: there are two main APIs ReDecode and ReDecodeBuffer, which look very similar to their encoding counterparts.

For each encoded chunk received from the encoding peer (step 208), decoder will take each input reference to a stored chunk and replace it with a span of data from the dictionary (step 209), thus reconstituting the data as it was received by the decoder (in a mutable dictionary situation the decoder will then execute the dictionary store action as requested by the chunk encoding verdict received from the peer, thus bringing its own dictionary in full sync with that of the peer, right after the peer has finished encoding the chunk).

Decoder will return a set of decoding verdicts matching those of encoding side, or appropriate error codes. All zero-copy considerations listed for the encoder are also valid here.

Bi-directional Processing

DRE library is fully bidirectional, meaning that an instance of the DRE library can encode traffic in one direction and decode traffic coming from the other direction.

To this end, a data dictionary is split in two halves: one half serves as an encoding dictionary for outgoing data, and another half as a decoding dictionary for incoming data. When peers open their DRE library handles, they pass a numeric context parameter to InitReEngine API, currently limited to values 0 and 1. When supporting multiple dictionaries on each side, the requirement that one side use an even number and another an odd one will still stand.

It is also possible that both encoder and decoder will be able to consult both directions dictionaries to look for repeating content, thus making it possible to download a large document, modify it, and then upload it back, and the upload will have its data reduced by encoder consulting the other direction's decoding dictionary.

Fixed vs. Mutable, Cold vs. Warm Dictionaries

Key to successful data reduction using DRE algorithm is its dictionary, which contains previously seen chunks of data that are likely to be seen again in the data stream. Encoder and decoder may start operating with an empty dictionary, populating it from live traffic as they go along. However, if we know (by means of out-of-band content analysis, or from data from the previous processing) which data is likely to appear on the link, we can bootstrap the dictionaries by reading initial content from a file. This mode is referred to as warm-dictionary mode, and the starting-from-scratch mode is referred to as cold dictionary mode.

In cold dictionary mode, dictionary content is gradually accumulated from the data stream, synchronously by both peers; in fact, for correct operation the state of dictionaries must be identical for every packet at the time of its encoding and decoding. This puts strict requirements on the algorithms that evict data chunks from the dictionary, mandates bulletproof recovery mechanisms, should one of the peer suffer a failure; also, it makes some sort of consistency verification almost mandatory.

DRE library maintains chunk generation numbers, increased when chunk data is evicted from the dictionary and replaced by a fresh one. This generation is transmitted along with the references to chunks in the encoded stream, and then used by the decoder to verify that the generation of a chunk in the decoding is the same as the one that came with the encoding reference. Even more rigorous mechanism would maintain a simple checksum of each chunk on both sides, but such solution would increase the size of encoded data.

DRE library also contains an API to reset the dictionary to its initial state, so if one side experiences a failure, it can send a signal to its peer to do a reset and encoding/decoding will start anew. Method provides a mechanism to send an in-stream message to the peer, requesting a reset, so a reset initiator will stop encoding (send packets as-is, relayed), request reset, and wait for a signal from a peer to perform its own reset, after which it can resume DRE encoding normally.

Operation of DRE described above assumes that encoding (and peer's decoding) dictionary is mutable, meaning that encoder modifies it, storing new chunks and evicting other ones. This requires a fail-proof lockstep dictionary operation of encoder and decoder; it also requires that decoders connecting to multiple encoder peers maintain a separate dictionary for each peer, so in a situation when many nodes connect to many peers in both directions, maintaining mutable dictionaries may become a problem.

To solve this, in a preferred embodiment this invention runs DRE inside a proxy or a cache with a fixed warm dictionary, which is bootstrapped from a file and is read-only, so multiple peers can use it without having to worry who talks to whom. This might slightly reduce the compression ratios, but will greatly simplify the dictionary maintenance, save memory/disk space etc. Experiments with live captures show that there is a fair amount of repeated data on the same link, day-to-day, so if we build a warm fixed dictionary from best-performing chunks (of a dynamically-built dictionary) on day N and use it to encode data on day N+1, we can expect only a slight degradation of the compression ratio. Thus the invention can effectively implement many-to-many topologies with one device serving as a live dictionary generator (with very possibly a larger dictionary than on the rest of the machines), the one device can be one of the nodes 110-112, or one of the nodes 121-124, or a separate node other than the nodes 110-112 and 121-124. If the one device is a separate node, it receives copies of data from one or more nodes 110-112 and 121-124. This generated dictionary will then be reduced by picking the best performing chunks, and be distributed as warm bootstrap for the subsequent operation to the rest of the devices.

The fixed dictionary mode is particularly attractive if there are several possible peers that can decode/encode traffic from/to an encoder/decoder (one-to-many), because encoder does not need to maintain separate dictionaries for each of its peers (that is, one dictionary for all its peers). It also simplifies the recovery mechanism, should one of the peers fail. This method has its downside: compression ratio may potentially degrade if the data in the stream does not contain anything that may be compressed by the fixed dictionaries. This fully depends on the traffic on the link; there are good indications that for many links traffic is repeatable day-to-day, so it is possible to build an initial state of the dictionary for day N+1 while compressing traffic for day N.

Preferably, the dictionary generator uses a separate instance of DRE, and runs in a separate thread from the main encoder.

External Dictionary Generator Manager (DGM)

An external process controls building and rotation of dictionaries. Its operation is described below. DGM is continuously building a dynamic compression dictionary, which it periodically uses to generate a fresh fixed dictionary. In a preferred embodiment, DGM builds fresh dictionaries on chosen servers that have enough memory resources (RAM and disk) to accommodate dictionary sizes large enough to fit an entire traffic volume between the fixed dictionary creation events, where the DGM can be outside of the chosen servers, or can be on one of the chosen servers, or can run as a distributed process on several of the chosen servers. However, the policies of ranking chunks described below have been successfully implemented in other embodiments of this invention to use size-constrained mutable dictionaries. In particular, it is possible to store such mutable dictionaries only in RAM.

Dictionary Generation Process

Figure 3:
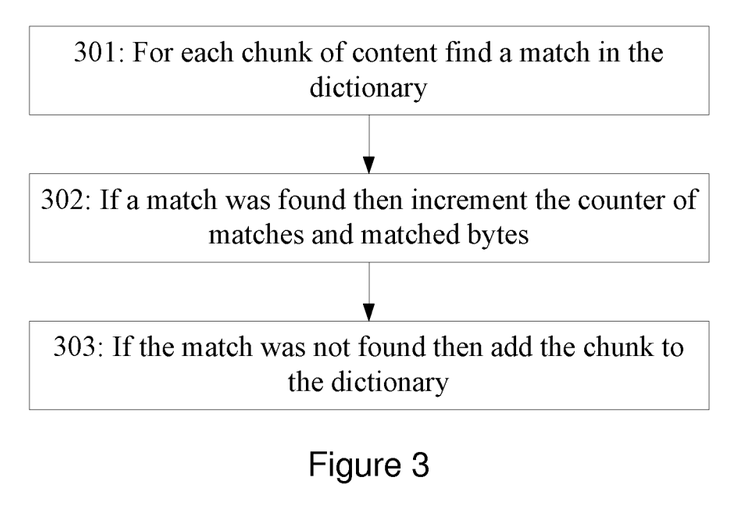
FIG. 3 is a flowchart of a mutable dictionary generation process according to an embodiment of the invention.

There are many ways to implement policies for generating a dictionary from chunks; a straight LRU (Least Recently Used) is simple, but has a huge drawback that it can discriminate against a stored chunk that has contributed a large share to compressing data, but was not recently matched due to some random fluctuations in traffic patterns. Therefore there needs to be some sort of a more sophisticated chunk ranking policy that can ensure that "best performers" in the dictionary are preserved and worst performers are properly penalized. On the other hand, it would be unfair to de-prioritize a chunk that has been just recently added (step 303 in FIG. 3) by not giving it a chance to contribute to compression, and it would not be wise to keep a good-performing chunk that has stopped contributing some time ago, so there needs to be some time consideration in an efficient ranking policy, as well. On yet another hand, implementing timestamps in dictionaries, caches, etc. is tedious and hurts performance.

To address this, the dictionary generation manager efficiently collects runtime chunk statistics (step 302 in FIG. 3), including, but not limited to: number of hits on a chunk (number of times it was referenced in a compressed chunk) and total number of bytes used in references to this chunk, the former being how often data from this chunk shows up in traffic, and the latter being how much of this data is actually being used for compression.

Figure 4:
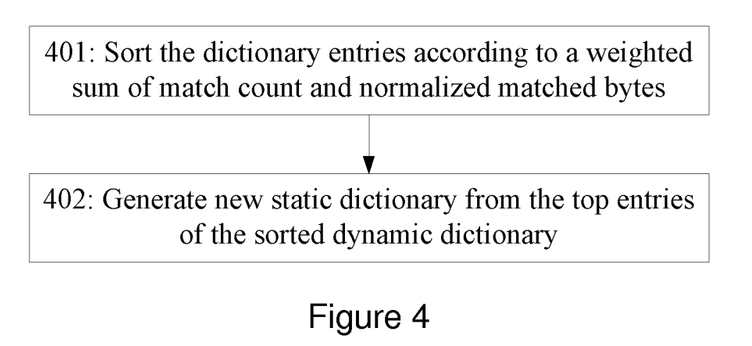
FIG. 4 is a flowchart of a fixed dictionary generation process according to an embodiment of the invention.

The ranking policy uses these chunk statistics to rank the entries in a following manner: a dictionary is split into two parts based on sorted statistics—a static part that has the top performers, and the bottom part (elimination pool) that contains candidates for elimination (step 401 in FIG. 4). The ranking function used in the preferred embodiment is a weighted sum of a hit count and a normalized cumulative byte count. However, other choices are possible and can contribute to further optimizing the compression rates. The relative sizes of the static part and the elimination pool are configurable, a default split is 50-50, at the same time in practice the invention uses an optimization approach to find the best ratio. Elimination pool implements a straight LRU to pick entries that will not be included in the fixed dictionary. If the size of the fixed dictionary is less or equal to the size of the static part, the corresponding piece of the static part will be chosen. If the size of the fixed dictionary is larger than the size of the static part, the static part plus a piece of the elimination pool will be chosen. As a result, top-performing chunks will be guaranteed to stay in the static part; however, if a chunk failed to be matched to, it will be subject to eviction. Conversely, a just-added chunk will have a chance be included in the fixed dictionary.

This algorithm is adequate for most applications, however it benefits from additional tuning to achieve optimal performance, and settings should be differently optimized for different deployments.

Examples Of Dictionary Generation Process Implementations

The first implementation example involves a single server. This server is chosen based on various considerations including CPU and memory processing power and availability, representative traffic patterns, traffic volume, etc. This server uses bi-directional traffic to create two separate dictionaries: the so-called "ingress" dictionary for inbound traffic and the "egress" dictionary for outbound traffic. The sizes of ingress and egress dictionaries may be usually different. All eligible traffic is being processed as described in the previous section. The two resulting dictionaries can be then combined into one dictionary used for compressing both outbound and inbound traffic, or they can be kept separate due to efficiency considerations as determined by compression statistics.

The second implementation example involves multiple servers. The advantages of this approach are that the resulting aggregated dictionaries can be more representative of the whole traffic, the tasks can be distributed and that the redundancy and failover can be easily implemented. However, there is additional complexity for distributing the tasks and aggregating the results. DGM is responsible for choosing servers, distributing tasks and collecting and combining the resulting dictionaries. For instance, if two servers are involved, then each server generates two dictionaries (ingress and egress) independently and then DGM collects and aggregates the dictionaries from all servers.

In both previous examples the dictionaries were generated based on all traffic flowing through the servers. However, there is a possibility of generating separate dictionaries for different Web domains (or even different URL patterns). Using dedicated dictionaries on a per-domain basis can ensure high compression ratios even for less-popular (in terms of the volume of traffic) domains. Also a CDN operator can choose not to compress some domains based on a priori knowledge of specific features of the corresponding content (for example, if there is no sufficient benefit of applying DRE to this domain due its use of a proprietary compression algorithm, etc.).

Server Side Rotation

At a certain moment (either periodically or when certain pre-defined conditions are met), DGM determines that is it time to start the dictionary rotation. DGM executes code to prepare the dictionary to be distributed, compress it, move it to the download location etc., and sends RotateDictionary message to all DRE modules. Each encoder and decoder module then sends an HTTP header option with a NewDictionary message to its peer, for example, the server 110 has servers 121-123 as its peers, and the server 121 has servers 110 and 111 as its peers, to signal the beginning of the dictionary rotation process, disables DRE encoding (if applicable), calls DRE API to rotate the dictionary and sends RotateDone message back to DGM.

At the next step, each DRE module waits for DictionaryUpdated message from the peer. When the message from the peer arrives, the DRE module resets runtime DRE context and switches to a new dictionary. The DRE module sends DictionaryUpdated message to the peer and re-enables DRE.

Client Side Rotation

The client-side proxy module receives RotateDictionary message and sends FetchDictionary message to its DGM, which in turn fetches the dictionary file. DGM uncompresses it and puts it into correct location (on the disk or in memory), then signals a DictionaryReady message to the proxy module.

When the DRE module receives DictionaryReady message from the DGM, it goes to Relay mode (DRE off), then resets its runtime DRE context and switches to just received dictionary. It then notifies its peer by sending DictionaryUpdated message. Then the DRE module waits for DictionaryUpdated message from the peer. When DictionaryUpdated message arrives, the DRE module re-enables DRE.

This scheme guarantees that at no time encoded content will go to the peer during dictionary update process, and DRE will remain off only for the duration of dictionary fetch and pre-processing by the peers.

Statistics

It is very important to be able to efficiently extract and display statistics from any running DRE client application. DRE library maintains internal engine statistics, keeping track of number of get/save/purge dictionary operations, as well as of main fingerprinting map statistics. It is also possible to extract the current state of the sorted chunk performance container, used by the dictionary purging algorithm. This data contains raw performance scores for each chunk in the dictionary, along with its current generation (this is incremented every time the chunk data is purged from the dictionary and replaced by the new one).

Applications using DRE additionally maintain their own statistics, such as total number of processed bytes, compression ratios and so on. All this information is kept in a memory-mapped file in binary format, and is periodically runtime-efficiently updated by the application. Outside programs can analyze and visualize this data, in particular, using a Web server to provide self-updating Web pages that may be viewed with a Web browser.

Alternative Embodiments

The foregoing descriptions of specific embodiments of the present invention are presented for the purposes of illustration and description. They are not intended to be exhaustive or to limit the invention to the precise forms disclosed. Many modifications and variations will be evident in view of the above teachings. The embodiments were chosen and described in order to best explain the principles of the invention and its practical applications, to thereby enable various embodiments with various modifications as are suited to the particular use contemplated. For example, the dictionaries and the corresponding software modules can reside on separate physical or virtual servers, communicating with content distribution software processes via standard remote process communication (RPC) methods etc.

As another example, the embodiments described provide traffic optimizations between nodes within the content distribution system or a peer-to-peer network. In an alternative embodiment, the invention provides such savings between the end-user devices and the content distribution nodes by being deployed on end-user computers, mobile phones, etc.

Figure 5:
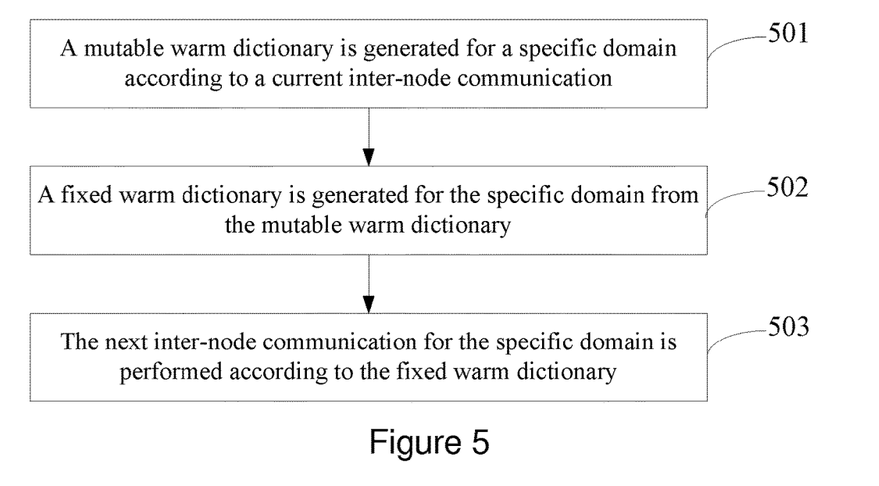
FIG. 5 illustrates a flow chart of a method for optimizing inter-node communication in a content distribution system according to an embodiment of the invention.

In summary, the embodiments of the invention provide a method for optimizing inter-node communication in a content distribution system consisting of at least two nodes, as illustrated in FIG. 5, including the following steps.

Step 501. A mutable warm dictionary is generated for a specific domain according to a current inter-node communication.

Step 502. A fixed warm dictionary is generated for the specific domain from the mutable warm dictionary.

Step 503. The next inter-node communication for the specific domain is performed according to the fixed warm dictionary.

Preferably, in the step 501, a content of the current inter-node communication is split into chunks; for each chunk, a match is found in a previous fixed warm dictionary, if the match is found, the number of hits on the chunk and total number of bytes used in references to the chunk are incremented; and if the match is not found, the chunk is added into the previous fixed warm dictionary.

Preferably, in the step 502, dictionary entries for chunks in the mutable warm dictionary are sorted according to a weighted number of hits and a normalized total number of bytes; and the fixed warm dictionary is generated from the top dictionary entries of the sorted mutable warm dictionary.

Preferably, the fixed warm dictionary is generated from the top dictionary entries of the sorted mutable warm dictionary includes: the sorted mutable warm dictionary is split into a static part and an elimination pool with a predetermined ratio; and the fixed warm dictionary is generated from the static part or from the static part and the elimination pool.

Preferably, the fixed warm dictionary includes an ingress dictionary for inbound traffic and/or an egress dictionary for outbound traffic.

Preferably, in the step 502, the fixed warm dictionary is generated on one or more nodes of the at least two nodes; and the fixed warm dictionary is distributed to all peer nodes of the one or more nodes.

Preferably, in the step 502, the fixed warm dictionary is generated on one or more nodes other than the at least two nodes; and the fixed warm dictionary is distributed to all of the at least two nodes.

Figure 6:
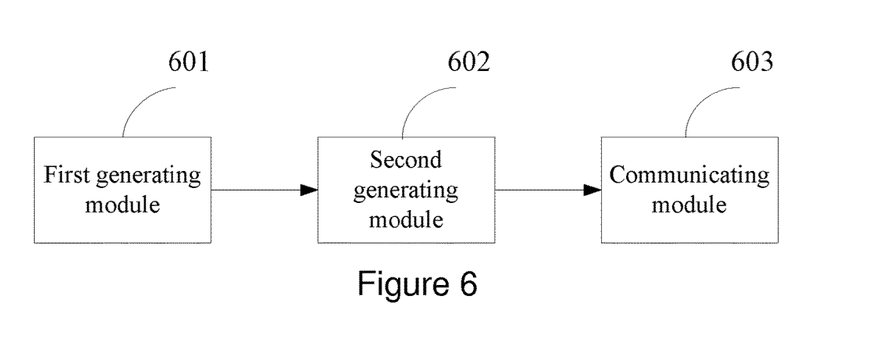
FIG. 6 illustrates a schematic diagram of a system for optimizing inter-node communication in a content distribution system according to an embodiment of the invention.

Furthermore, the embodiments of the invention provide a system for optimizing inter-node communication in a content distribution system consisting of at least two nodes, as illustrated in FIG. 6, including: a first generating module 601 configured to generate a mutable warm dictionary for a specific domain according to a current inter-node communication; a second generating module 602 configured to generate a fixed warm dictionary for the specific domain from the mutable warm dictionary; and a communicating module 603 configured to perform the next inter-node communication for the specific domain according to the fixed warm dictionary.

Preferably, the first generating module 601 is further configured to split a content of the current inter-node communication into chunks; for each chunk, find a match in a previous fixed warm dictionary; if the match is found, increment the number of hits on the chunk and total number of bytes used in references to the chunk; and if the match is not found, add the chunk into the previous fixed warm dictionary.

Preferably, the second generating module 602 is further configured to sort dictionary entries for chunks in the mutable warm dictionary according to a weighted number of hits and a normalized total number of bytes; and generate the fixed warm dictionary from the top dictionary entries of the sorted mutable warm dictionary.

Preferably, the second generating module 602 is further configured to split the sorted mutable warm dictionary into a static part and an elimination pool with a predetermined ratio; and generate the fixed warm dictionary from the static part or from the static part and the elimination pool.

Preferably, the fixed warm dictionary includes an ingress dictionary for inbound traffic and/or an egress dictionary for outbound traffic.

Preferably, the second generating module 602 is further configured to generate the fixed warm dictionary on one or more nodes of the at least two nodes; and distribute the fixed warm dictionary to all peer nodes of the one or more nodes.

Preferably, the second generating module 602 is further configured to generate the fixed warm dictionary on one or more nodes other than the at least two nodes; and distribute the fixed warm dictionary to all of the at least two nodes.

Implementations of the subject matter and the operations described in this specification can be implemented in digital electronic circuitry, or in computer software, firmware, or hardware, including the structures disclosed in this specification and their structural equivalents, or in combinations of one or more of them.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method for optimizing inter-node communication in a content distribution system consisting of at least two nodes, the method comprising:
   generating a mutable warm dictionary for a specific domain according to a current inter-node communication by splitting a content of the current inter-node communication into chunks, searching for a match for each of the chunks in a previous fixed warm dictionary, incrementing a number of hits on said chunk and total number of bytes used in reference to said chunk when the match is found, and adding said chunk into the previous fixed warm dictionary when the match is not found;
   generating a read-only fixed warm dictionary for the specific domain from the mutable warm dictionary by sorting dictionary entries for the chunks in the mutable warm dictionary according to a weighted number of hits and a normalized total number of bytes, and generating the read-only fixed warm dictionary from one or more top dictionary entries of the sorted mutable warm dictionary by splitting the sorted mutable warm dictionary into a static part and an elimination pool with a predetermined ratio and generating the read-only fixed warm dictionary from the static part; and
   performing a next inter-node communication for the specific domain according to the read-only fixed warm dictionary.

2. The method of claim 1, wherein the read-only fixed warm dictionary comprises an ingress dictionary for inbound traffic and/or an egress dictionary for outbound traffic.

3. The method of claim 1, wherein generating the read-only fixed warm dictionary for the specific domain from the mutable warm dictionary comprises:
   generating the read-only fixed warm dictionary on one or more nodes of the at least two nodes; and
   distributing the read-only fixed warm dictionary to all peer nodes of the one or more nodes.

4. The method of claim 1, wherein generating the read-only fixed warm dictionary for the specific domain from the mutable warm dictionary comprises:
   generating the read-only fixed warm dictionary on one or more nodes other than the at least two nodes; and
   distributing the read-only fixed warm dictionary to all of the at least two nodes.

5. A system for optimizing inter-node communication in a content distribution system consisting of at least two nodes, the system comprising:
   a memory configured to store computer readable instructions; and
   at least one processor configured to execute the computer readable instructions to:
   generate a mutable warm dictionary for a specific domain according to a current inter-node communication by splitting a content of the current inter-node communication into chunks, searching for a match for each of the chunks in a previous fixed warm dictionary, incrementing a number of hits on said chunk and total number of bytes used in reference to said chunk when the match is found, and adding said chunk into the previous fixed warm dictionary when the match is not found;

generate a read-only fixed warm dictionary for the specific domain from the mutable warm dictionary by sorting dictionary entries for the chunks in the mutable warm dictionary according to a weighted number of hits and a normalized total number of bytes, and generating the read-only fixed warm dictionary from one or more top dictionary entries of the sorted mutable warm dictionary by splitting the sorted mutable warm dictionary into a static part and an elimination pool with a predetermined ratio and generating the read-only fixed warm dictionary from the static part; and perform a next inter-node communication for the specific domain according to the read-only fixed warm dictionary.

6. The system of claim 5, wherein the read-only fixed warm dictionary comprises an ingress dictionary for inbound traffic and/or an egress dictionary for outbound traffic.

7. The system of claim 5, wherein the at least one processor is further configured to execute the computer readable instructions to:
generate the read-only fixed warm dictionary on one or more nodes of the at least two nodes; and
distribute the read-only fixed warm dictionary to all peer nodes of the one or more nodes.

8. The system of claim 5, wherein the at least one processor is further configured to execute the computer readable instructions to:
generate the read-only fixed warm dictionary on one or more nodes other than the at least two nodes; and
distribute the read-only fixed warm dictionary to all of the at least two nodes.

* * * * *